United States Patent [19]
Sakai et al.

[11] Patent Number: 6,090,205
[45] Date of Patent: Jul. 18, 2000

[54] APPARATUS FOR PROCESSING SUBSTRATE

[75] Inventors: Mitsuhiro Sakai, Kumamoto-ken; Kiyohisa Tateyama, Kumamoto, both of Japan

[73] Assignee: Tokyo Electron Limited, Tokyo, Japan

[21] Appl. No.: 09/152,340

[22] Filed: Sep. 14, 1998

Related U.S. Application Data

[62] Division of application No. 08/635,874, Apr. 18, 1996, Pat. No. 5,853,961.

[30] Foreign Application Priority Data

Apr. 19, 1995 [JP] Japan .................................. 7-119328

[51] Int. Cl.$^7$ .................................................. B05C 13/02
[52] U.S. Cl. .......................... 118/500; 118/52; 118/317; 118/320
[58] Field of Search .................. 118/52, 319, 320, 118/500; 269/21; 134/64 R

[56] References Cited

U.S. PATENT DOCUMENTS

| | | | |
|---|---|---|---|
| 3,601,029 | 8/1971 | Needleman | 95/89 R |
| 3,721,175 | 3/1973 | Needleman | 95/95 |
| 4,693,211 | 9/1987 | Ogami et al. | 118/725 |
| 4,696,885 | 9/1987 | Vijan . | |
| 4,755,844 | 7/1988 | Tsuchiya et al. | 354/317 |
| 4,788,992 | 12/1988 | Swainback et al. | 134/64 R |
| 4,822,639 | 4/1989 | Fujii et al. | 118/52 |
| 4,886,012 | 12/1989 | Ikeno et al. | 118/320 |
| 4,899,686 | 2/1990 | Toshima et al. | 118/52 |
| 5,095,848 | 3/1992 | Ikeno | 118/52 |
| 5,405,508 | 4/1995 | Kawakami et al. | 204/102 |
| 5,562,772 | 10/1996 | Neoh | 18/52 |
| 5,678,116 | 10/1997 | Sugimoto et al. | 396/611 |
| 5,689,749 | 11/1997 | Tanaka et al. | 396/611 |
| 5,716,673 | 2/1998 | Yen et al. | 118/52 |

FOREIGN PATENT DOCUMENTS 5-158055  6/1993  Japan .

*Primary Examiner*—Laura Edwards
*Attorney, Agent, or Firm*—Oblon, Spivak, McClelland, Maier & Neustadt, P.C.

[57] ABSTRACT

A method of processing a substrate having the steps of placing a substrate for forming an LCD on a support, mounting a cover on the substrate in such a manner that a clearance is formed from at least either surface of the substrate placed on the support, introducing developer or pure water into the clearance, bringing the developer or pure water into contact with at least either surface of the substrate, processing the substrate with the developer or pure water, removing the cover from the substrate, and discharging the substrate from the support.

14 Claims, 7 Drawing Sheets

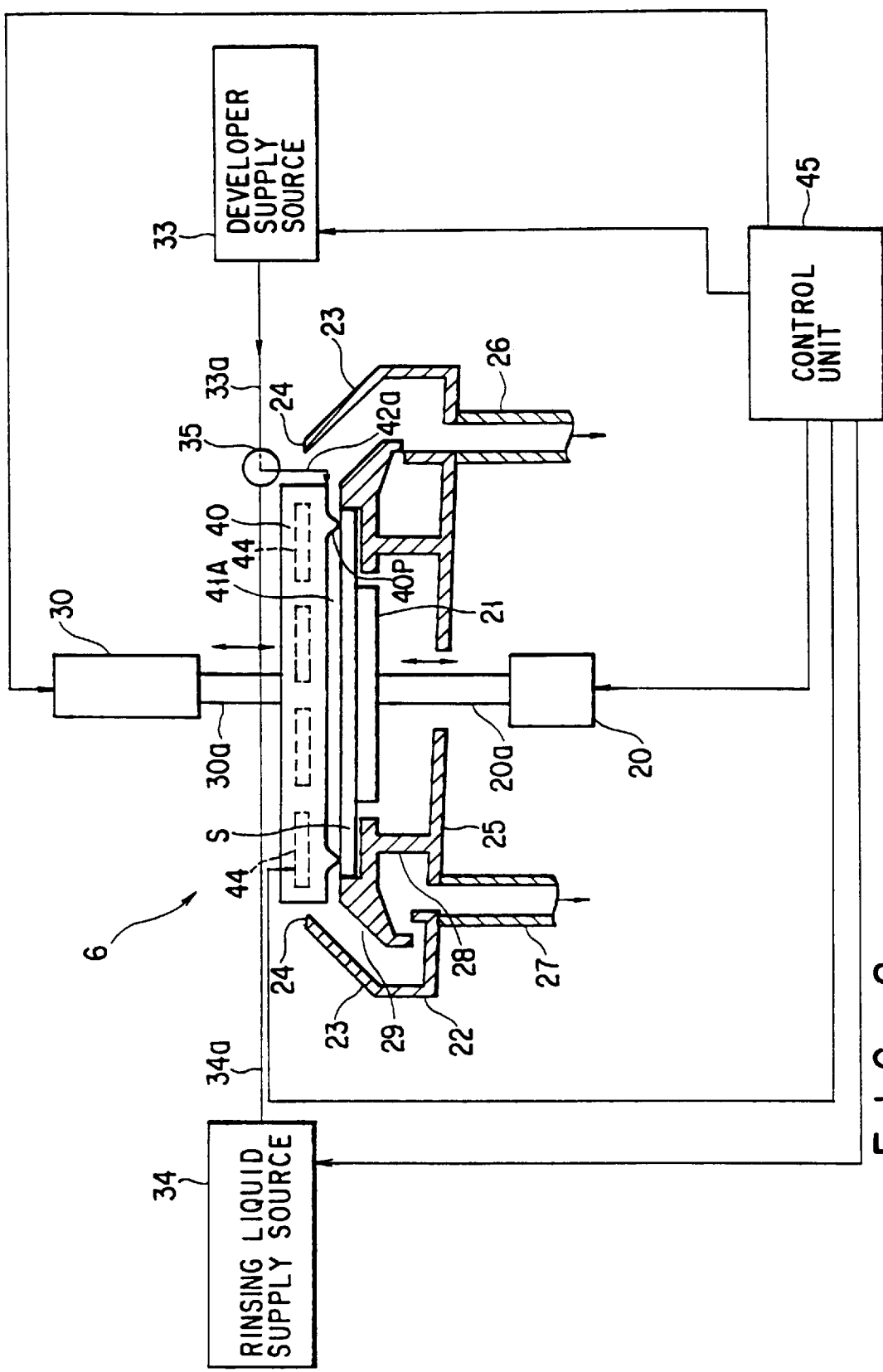
F I G. 2

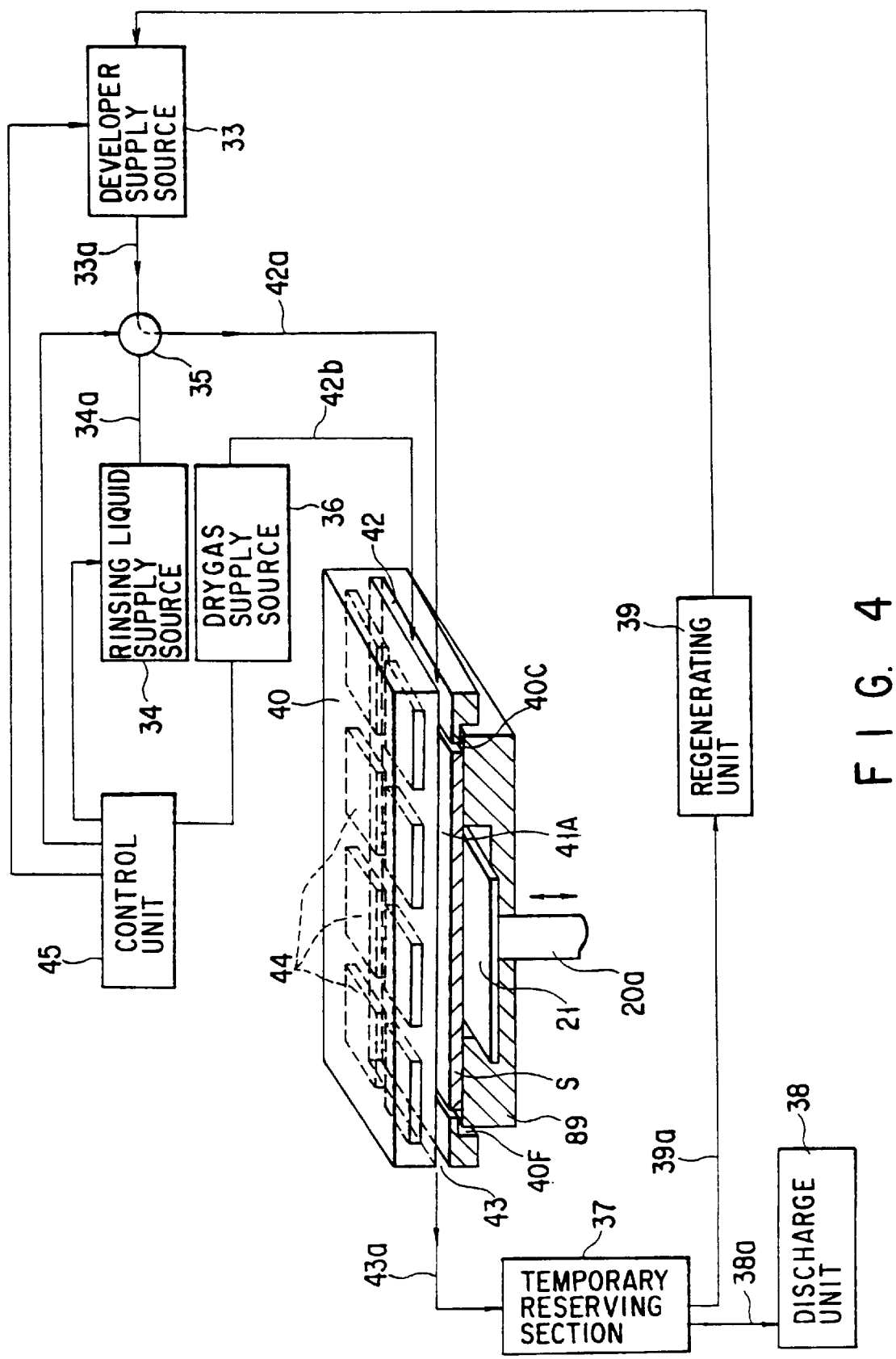
F I G. 4

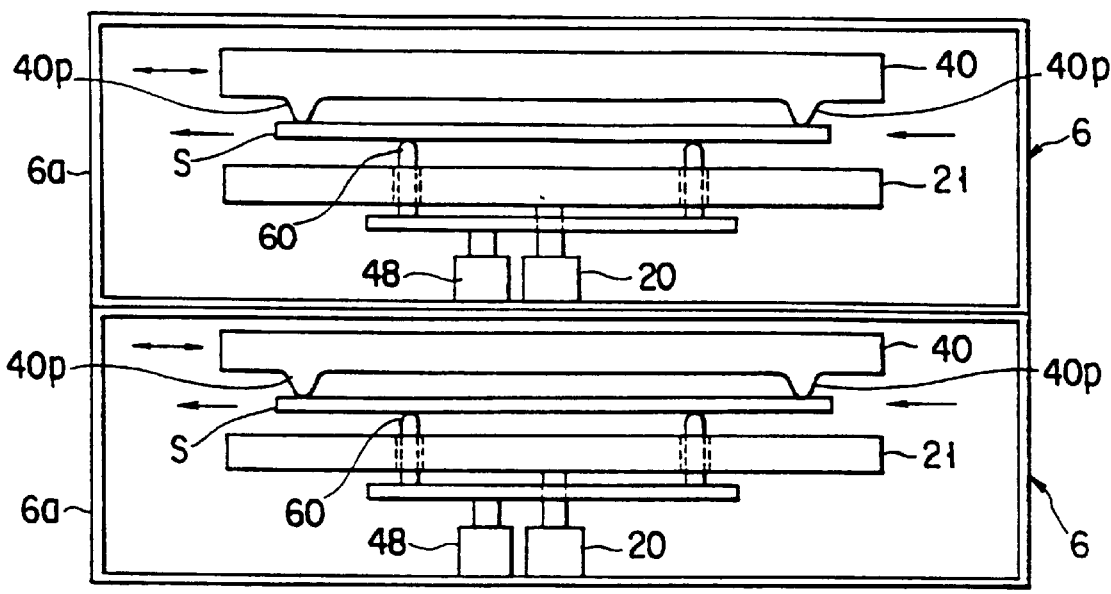
F I G. 8
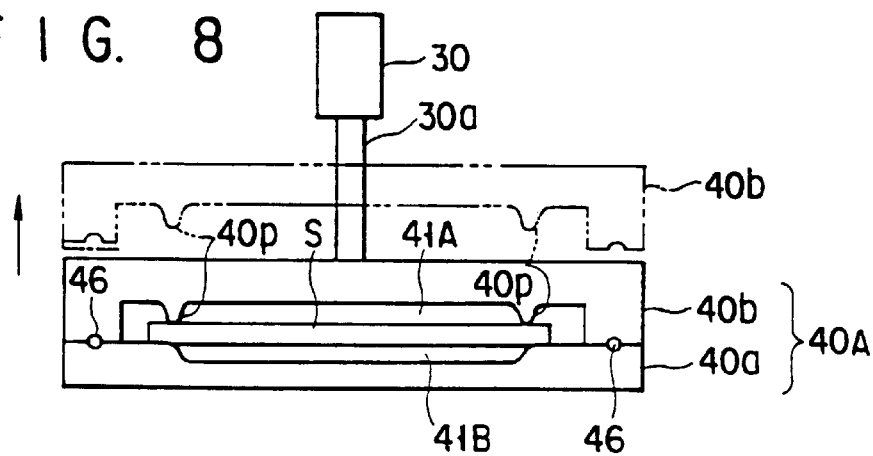
F I G. 9
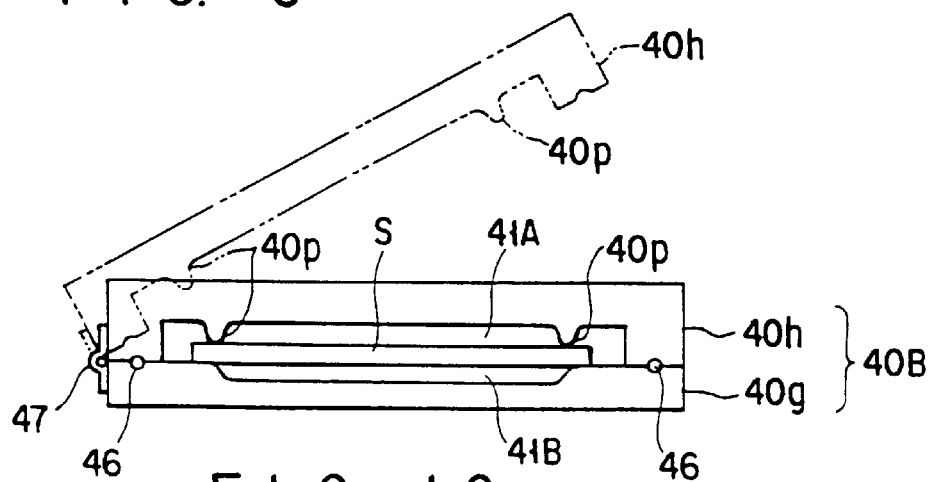
F I G. 10

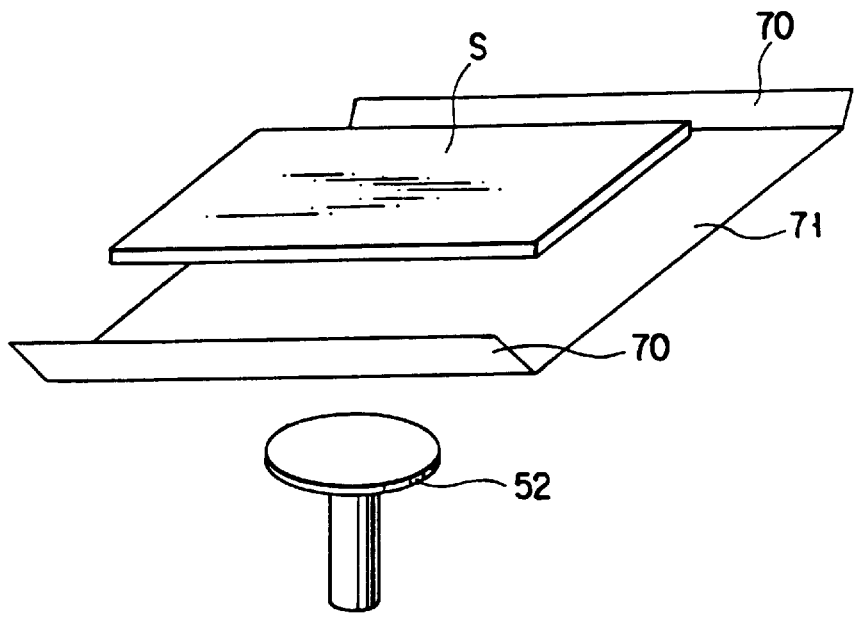
F I G. 1 3
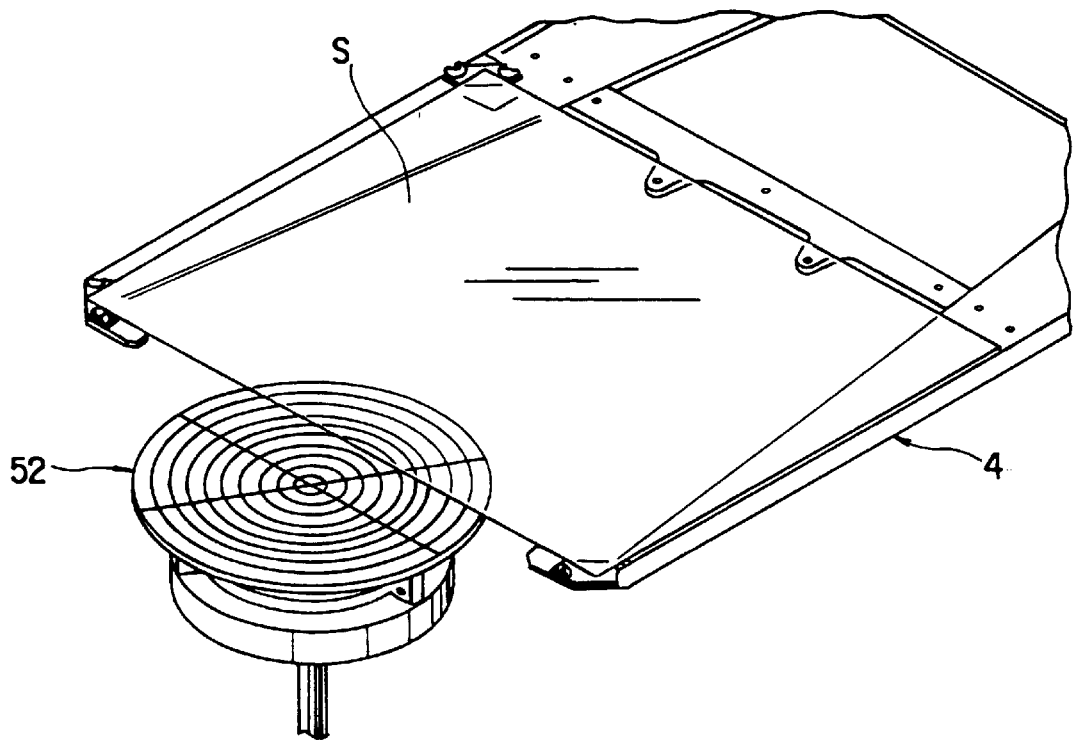
F I G. 1 4

APPARATUS FOR PROCESSING SUBSTRATE

This application is a Division of application Ser. No. 08/635,874, filed on Apr. 18, 1996 now U.S. Pat. No. 5,853,961.

BACKGROUND OF THE INVENTION

1. Field of the Invention

The present invention relates to a method of processing a substrate and an apparatus for processing a substrate such that a substrate, such as a semiconductor wafer or a glass substrate for an LCD, is subjected to a cleaning process or a development process.

2. Description of the Related Art

When an LCD (Liquid Crystal Display Device) is manufactured, a so-called lithography process is employed in order to form a resist film pattern on the upper surface of a glass substrate. The lithography process includes various processes, such as cleaning of a substrate, applying a resist film on the surface of the substrate, exposing the applied resist film to light and developing the same. Among the foregoing processes in the lithography process, the development process is one of processes that must be severely controlled. In the development process, it is an important fact that developer must uniformly be supplied to the upper surface of the applied resist so as to uniformly develop the applied resist on the overall surface of the substrate.

As a general rule, novolac resin is employed as the resist for use in the development process, and tetramethylammonium hydroxide (TMAH) solution is, as the developer, employed in which 2.38 wt % of TMAH is dissolved in water. The foregoing water-soluble developer cannot easily wet a water-repellent resist film. Thus, the developer is shed by the resist film. Therefore, the developer cannot easily be spread uniformly on the overall surface of the resist film, thus resulting in portions, on which the developer is retained in a large quantity, and portions, on which the developer is retained in a small quantity, being realized. As a result, development results in non-uniform state.

If the resist film applied with the developer is allowed to stand, fitting between the resist film and the developer is unsatisfactory, thus resulting in bubbles being generated in the developer. The portion, in which bubbles have been generated, results in insufficient development being taken place. Thus, a so-called defective development is carried out.

If the cleaning process is performed such that the substrate, which is being spun, is cleaned with a brush while putting cleaning solution, such as pure water, the cleaning solution splashes to the portion around the substrate. Thus, there arises a problem in that the spin chuck and a portion in the vicinity of the same are contaminated.

SUMMARY OF THE INVENTION

An object of the present invention is to provide an apparatus for processing a substrate capable of performing a uniform development process without a defect in development and a method therefor.

Another object of the present invention is to provide an apparatus for processing a substrate capable of preventing splashing of treatment liquid and thus preventing contamination of the environmental region and a method therefor.

Substrates have been resist-processed by a known method selected from three methods consisting of a spinning method, a dipping method and a spraying method. The spinning method has the step of spinning the substrate in a cup by a motor to develop, rinse and dry the substrate. The dipping method is a method in which the substrate is dipped in a developer to perform uniform development by using vibrations of the substrate or by stirring the developer. The spraying method is a method in which a developer pressurized by a pump or the like is sprayed to the surface of the substrate. Among the foregoing methods, the spinning method has mainly be employed.

According to one aspect of the present invention, there is provided a method of processing a substrate comprising: a loading step for loading a substrate onto a support; a cover mounting step for mounting a cover on the substrate in such a manner that a clearance is formed from at least either surface of the substrate placed on the support; a processing step for introducing a treatment liquid into the clearance to bring the treatment liquid into contact with at least either surface of the substrate; a cover removing step for removing the cover from the substrate; and an unloading step for unloading the substrate from the support.

According to another aspect of the present invention, there is provided an apparatus for processing a substrate comprising: a chamber; a support on which a substrate to be introduced into the chamber is placed; a cover for covering the substrate in such a manner that a clearance is formed from at least either surface of the substrate placed on the support; supply means for supplying treatment liquid into the clearance; and discharge means for discharging the treatment liquid in the clearance.

According to another aspect of the present invention, there is provided a method of processing a substrate comprising: a loading step for loading a substrate on a support; an inclining step for inclining the substrate together with the support; and flowing-down step for causing the treatment liquid to flow downwards along the surface of the substrate from an upper portion of the inclined substrate toward a lower portion of the inclined substrate.

According to another aspect of the present invention, there is provided an apparatus for processing a substrate comprising: a cup; a support which is disposed in the cup and on which a substrate is placed; means for inclining the substrate on the resist with respect to a horizontal plane; a supply gutter for supplying a treatment liquid from a position adjacent to an upper portion of the inclined substrate; and a receiving gutter for receiving the treatment liquid at a position adjacent to a lower portion of the inclined substrate.

On the surface of the substrate, a resist film is, by a resist-film applying apparatus, previously formed. After a baking process has been completed, a predetermined pattern is exposed to the foregoing resist film. In the present invention, after the foregoing exposure process has been completed, a developer in the form of laminar flow is allowed to flow along the upper surface of the substrate so that the developer is uniformly supplied to the upper surface of the resist film. Since a new developer is always supplied to the upper surface of the resist film, the time required to complete the development process can be shortened. Therefore, the present invention enables the uniformity of development to be maintained. Thus, a clean, defect-less and excellent product can be provided, and the throughput can be improved.

To allow the developer in the form of laminar flow to flow, it is effective to mount a cover for covering overall upper surface of the substrate while forming a predetermined clearance from the upper surface of the substrate, followed by causing the developer to flow into the clearance. Another method is effective in which the substrate is inclined and the inclination is used to allow the developer to flow along the upper surface of the developer. Either of the foregoing methods enables the developer in the laminar flow to be allowed to flow so that the developer is uniformly supplied to the upper surface of the resist film. Thus, a uniform development process exhibiting excellent throughput can be performed.

In the case where the structure is arranged such that the developer, which has allowed to flow along the upper surface of the substrate, is again allowed to flow along the upper surface of the substrate by a pump or the like so that the developer is recycled. Thus, the quantity of the developer can be saved and the running cost can be reduced.

Since the cover coves the upper surface of the substrate, neither the rinsing solution nor the developer flows to the components the apparatus which surround the support. The substrate can therefore be processed in clean environment.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 is a partially-broken cross sectional view of a block diagram showing the structure of an apparatus for processing a substrate according to a first embodiment of the present invention;

FIG. 4 is a perspective block diagram showing the structure of the apparatus for processing a substrate according to the first embodiment of the present invention;

FIG. 8 is an internal perspective view showing an apparatus for processing a substrate having a vertical double-stage type structure;

FIG. 9 is a diagram showing a dipping-type apparatus for processing a substrate having a mechanism for elevating a cover;

FIG. 10 is a diagram showing the dipping-type apparatus for processing a substrate having the cover opening and closing mechanism;

FIG. 13 is a perspective view showing a method of placing a substrate for forming an LCD according to the second embodiment of the present invention; and FIG. 14 is a perspective view showing the conveyance of the substrate for forming an LCD according to the second embodiment of the present invention.

DETAILED DESCRIPTION OF THE PREFERRED EMBODIMENTS

Figure 1:
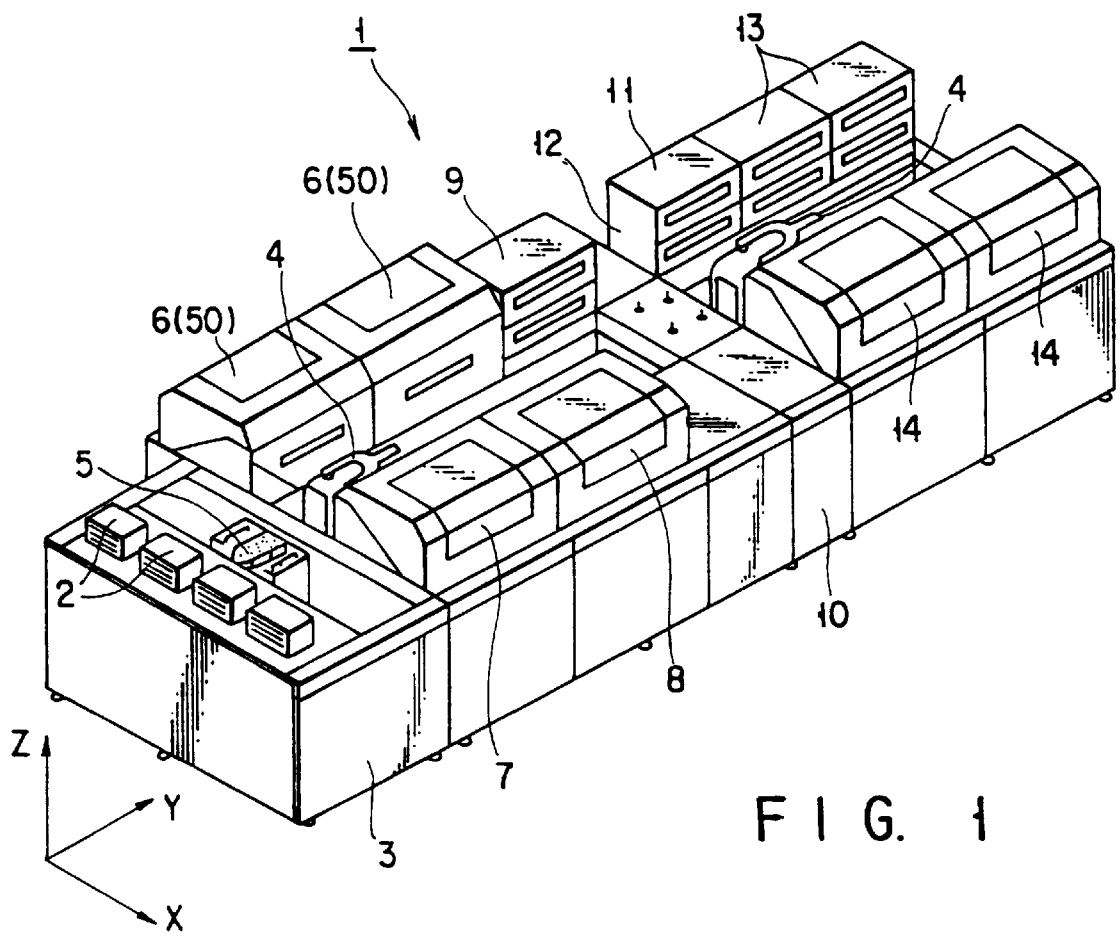
FIG. 1 is a perspective view schematically showing the overall body of a resist processing system.

Referring to the attached drawings, preferred embodiments of the present invention will now be described. As shown in FIG. 1, a resist processing system 1 has a cassette station 3 at an end thereof. The cassette station 3 is arranged to receive a plurality of cassettes 2 each accommodating a substrate S for forming an LCD. The cassette station 3 has, at a position adjacent to the front surfaces of the cassettes 2, a sub-arm 5 for conveying and positioning the substrate S and holding the substrate S to deliver and receive the same to and from main arms 4. Two main arms 4 are, in series, disposed in such a manner that the main arms 4 are able to move in the lengthwise direction in the central portion of the processing system 1. A variety of processing units, such as developing units 6 (50), are disposed on the two sides of the passage for the main arms 4.

In the processing system 1 shown in FIG. 1, a brush scrubber 7 for cleaning the substrate S with a brush thereof, a high-pressure jet cleaning machine 8 for cleaning the same with high pressure jet water and the like are disposed in series on the side of the cassette station 3. Two developing units 6 (50) are disposed in series at opposite positions across the passage for the main arms 4. Moreover, two heating units 9 are stacked adjacent to the developing units 6 (50).

An adhesion unit 11 for subjecting the substrate S to a hydrophobic process before the resist film is applied is disposed on the side of the foregoing units through a connection interface unit 10. A cleaning unit 12 for cooling is disposed below the adhesion unit 11. Two lines each consisting of two heating units 13 are disposed on the side of the adhesion unit 11 and the cleaning unit 12 for cooling in such a manner that the two heating units 13 are stacked. Two resist-film applying units 14 for applying the resist solution to the substrate S to form a resist film (a photosensitive film) on the surface of the substrate S are disposed at opposite positions across the passage for the main arms 4. Although omitted from illustration, an exposing unit and the like for exposing a predetermined fine pattern to the resist film formed on the substrate S are disposed on the side of the resist-film applying units 14.

Figure 3:
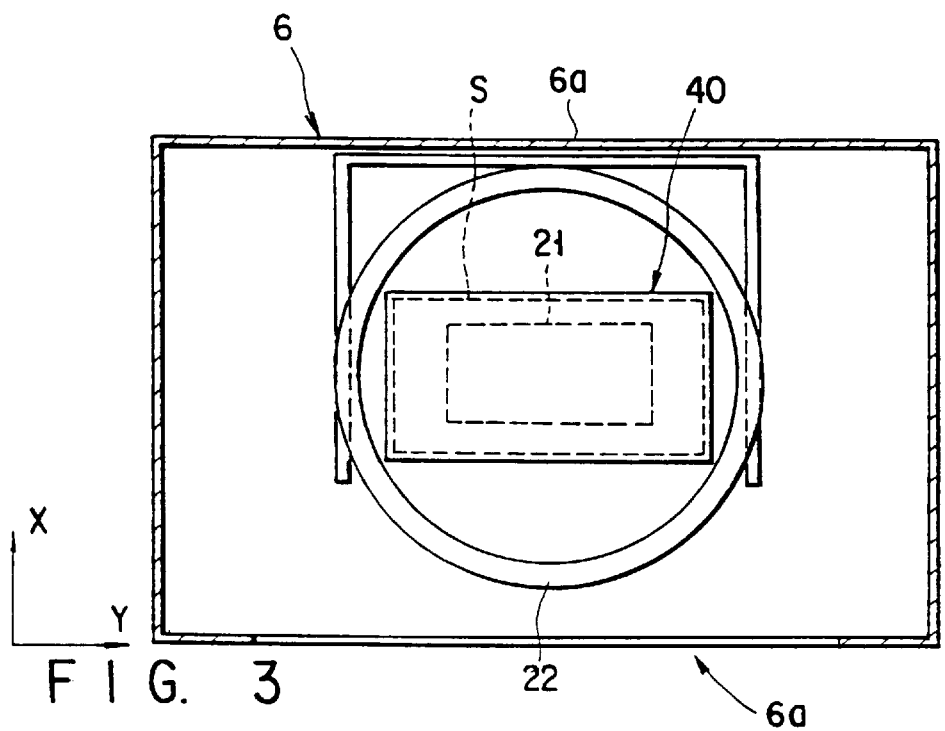
FIG. 3 is a plan view showing the apparatus for processing a substrate according to the first embodiment of the present invention.

As shown in FIGS. 2 and 3, a cup 22 is disposed in a substantially central portion of a chamber 6a of the developing unit 6. A support 21 is disposed in the cup 22. The support 21 has an upper surface having a suction opening of a vacuum suction mechanism (not shown) so as to suck and hold the substrate S on the upper surface of the support 21. The lower surface of the support 21 is connected to a rod 20a of a first air cylinder 20 so that the support 21 is supported while being permitted to be moved upwards and downwards. A control unit 45 is connected to a circuit for an air supply source for the first air cylinder 20 so that the distance for which the support 21 is moved is optimally controlled in response to a detection signal transmitted from a sensor (not shown).

An annular cup 22 is disposed to surround the substrate S sucked by and held on the support 21 so as to prevent splashing of the developer and cleaning water (rinsing solution). The cup 22 is made of corrosion-resisting resin or metal. The cup 22 has an upper portion 23 which is tapered in such a manner that an upper opening 24 of the cup 22 has a diameter which permits the substrate S to be smoothly and downwards introduced into the cup 22. The cup 22 has a bottom portion 25 which is slightly inclined with respect to the horizontal plane. A waste-solution pipe 26 is connected to a lower portion of the bottom portion 25. On the other hand, an exhaust pipe 27 for discharge atmospheric gas in the cup 22 is connected to an upper portion of the bottom portion 25. An annular wall 28 extends upwards over the bottom portion 25. A rectifying plate 29 is disposed at the top end of the annular wall 28. The rectifying plate 29 is disposed adjacent to the reverse surface of the substrate S placed on the support 21, the rectifying plate 29 having a peripheral portion inclined downwards. The rectifying plate 29 having the foregoing structure introduces waste solution, with which the substrate S has been processed, into the bottom portion 25 of the cup 22.

A plurality of rinsing-solution jet nozzles (not shown) are disposed below the support 21 so that pure water is sprayed to the reverse surface of the substrate S placed on the support 21 to clean the reverse surface of the substrate S.

As shown in FIG. 2, a cover 40 is disposed above the support 21. The cover 40 is connected to and supported by a rod 30a of an air cylinder 30 so as to be permitted to move upwards and downwards in the direction of Z-axis. A circuit for an air supply source for the air cylinder 30 is connected to the control unit 45 so that the operation of the air cylinder 30 is controlled by the control unit 45.

A plurality of projections 40P are formed in the peripheral portion of the lower surface of the cover 40. When the cover 40 has been moved downwards, the projections 40P are pushed against the substrate S on the support 21 so that a clearance 41A is formed between the lower surface of the cover 40 and the upper surface of the substrate S. It is preferable that the clearance 41A be set to be within a range from 0.5 mm to 10 mm. In a case where the developer is allowed to flow in the clearance 41A, it is preferable that the clearance 41A be set to be within a range from 0.5 mm to 2 mm. In a case where the developer is temporarily retained in the clearance 41A so as to dip the substrate S in the developer, it is preferable that the clearance 41A be set to be within a range from 2 mm to 10 mm. Note that it is preferable that the projections 40P be made of soft engineering plastic to protect the substrate S from being damaged.

A plurality of ultrasonic oscillators 44 are embedded in the cover 40. A power source (not shown) for each of the ultrasonic oscillators 44 is connected to the control unit 45. Ultrasonic waves oscillated from the ultrasonic oscillators 44 are propagated to the surface of the substrate S through the rinsing solution so that the effect of the cleaning operation in the cleaning process is enhanced.

As shown in FIG. 4, a slit-shape inlet portion 42 and an outlet portion 43 are formed on the two side surfaces of the cover 40. The inlet portion 42 and the outlet portion 43 are connected to a recessed portion 40C formed in the central portion of the lower portion of the cover 40. When the cover 40 covers the substrate S placed on the support 21, the substrate S is received within the recessed portion 40C. Moreover, the clearance 41A is formed between the upper surface of the substrate S and the cover 40. Note that the width of each of the inlet portion 42 and the outlet portion 43 is about 0.5 mm to about 2 mm.

A flange 40F is formed around the peripheral portion of the lower portion of the cover 40. The flange 40F is pushed against a frame 89 through an O-ring (not shown) to seal solution flowing in the clearance 41A and/or solution retained temporarily in the clearance 41A so that downward leakage of the solution is prevented. The upper surface of the flange 40 and that of the substrate S are substantially flush with each other.

A developer supply source 33 and a rinsing-solution supply source 34 are connected to the inlet portion 42 of the cover 40 through a first flow path 42a. Moreover, a dry-gas supply source 36 is connected to the inlet portion 42 through a second flow path 42b. The developer supply source 33 accommodates tetramethylammonium hydroxide (TMAH) solution. The rinsing-solution supply source 34 accommodates pure water. The dry-gas supply source 36 accommodates dry air or dry nitrogen gas.

On the other hand, a temporary reserving portion 37 is connected to the outlet portion 43 of the cover 40 through a flow path 43a. The capacity of the temporary reserving portion 37 is sufficiently larger than that of the clearance 41A. Therefore, the temporary reserving portion 37 has a function of separating gas and liquid from each other so that the gas component is allowed to flow through a discharge passage 38a so as to be discharged to the outside of a clean room from a discharge unit 38. On the other hand, the liquid component is allowed to flow through a regenerating passage 39a so that impurities of the liquid component are removed by a regenerating unit 39. Then, the solution regenerated in the regenerating unit 39 is returned to the developer supply source 33.

By making the clearance 41A to be a narrow value of about 0.5 mm to about 2 mm, the developer and rinsing solution, which pass through the clearance 41A, can be formed into laminar flows. Thus, the developer and the rinsing solution can uniformly be supplied to the overall surface of the resist film on the upper surface of the substrate S even if the quantity is reduced. In order to cause the treatment liquid to uniformly pass through the clearance 41A, the flow path circuit for the treatment liquid is hermetically sealed to prevent liquid leakage by a binding member (not shown) comprising a buffer tank portion (not shown) and a pressure-loss generating portion (not shown).

Figure 7:
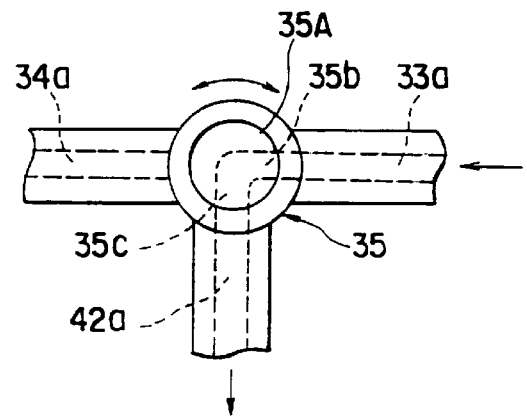
FIG. 7 is a partially enlarged view showing a flow path switch valve for switching a flow path for treatment liquid.

As shown in FIG. 7, a fluid switch valve 35 is disposed at a branched portion of the first flow path 42a. With the fluid switch valve 35, switching is enabled between a communication passage 33a for the developer supply source 33 and a communication passage 34a for the rinsing-solution supply source 34. That is, the fluid switch valve 35 has a rotor 35A in which two flow paths 35b and 35c are formed. By rotating the rotor 35A, the flow path 35b can be connected to the communication passage 33a as well as the flow path 35c can be connected to the first flow path 42a. As an alternative to this, the flow path 35b can be connected to the first flow path 42a as well as the flow path 35c can be connected to the communication passage 34a.

Figure 5:
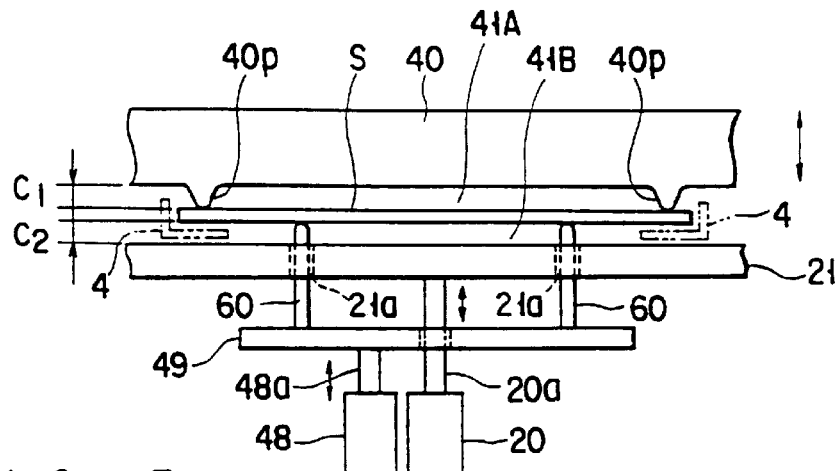
FIG. 5 is a partially enlarged view showing an essential portion of the apparatus for processing a substrate according to the first embodiment of the present invention.
Figure 6:
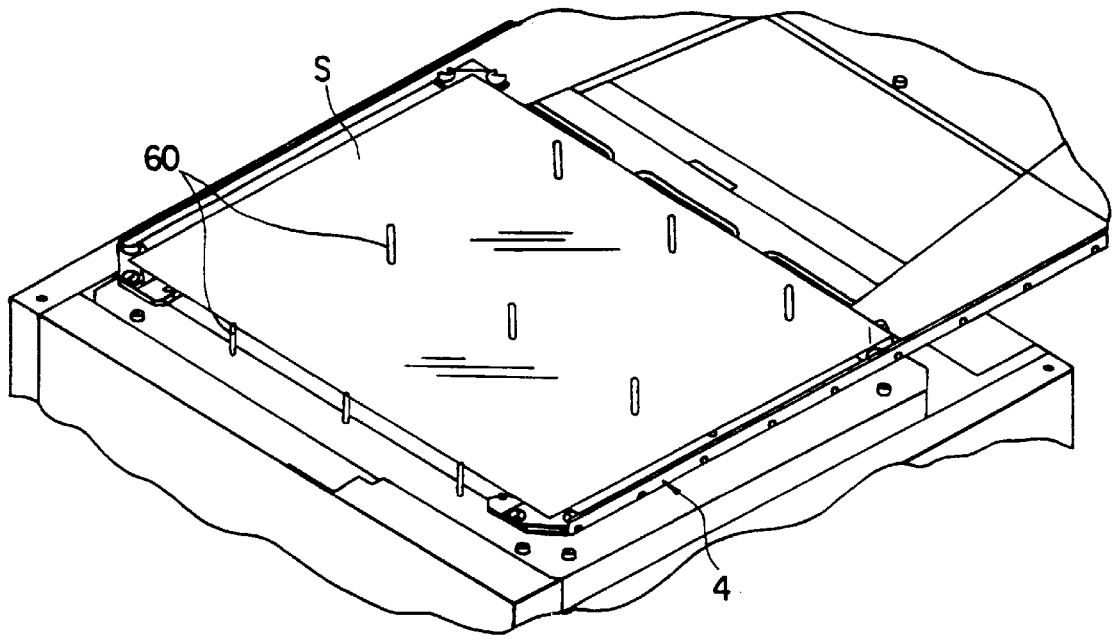
FIG. 6 is a perspective view showing conveyance of a substrate for forming an LCD in the apparatus for processing a substrate according to the first embodiment of the present invention.

As shown in FIGS. 5 and 6, a mechanism for upwardly pushing a substrate and having pins 60 is disposed below the support 21 so that the substrate S is raised from the support 21 by the plural pushing pins 60. The pushing pins 60 are connected to a rod 48a of a second air cylinder 48 through a common plate member 49 so that the pushing pins 60 are enabled to project over the support 21 through openings 21a formed in the support 21. The substrate S is, by the pushing pins 60, raised over the support 21 so that the substrate S is delivered and received between the main arm 4 and the support 21. Each of the main arms 4 has an X-axis drive mechanism, Y-axis drive mechanism, Z-axis drive mechanism and a Q-rotation drive mechanism so as to be capable of moving along the central passage to make an access to each of the processing unit 6 (50), 9, and 11 to 13. The main arm 4 is able to introduce the substrate S into each of the processing unit 6 (50), 9, and 11 to 13 and to discharge the substrate S from the processing unit 6 (50), 9, and 11 to 13. In the case where the substrate S is introduced or discharged into or from the developing unit 6, the main arm 4 holding the substrate S is introduced into the developing unit 6 through the opening 6b.

As shown in FIG. 8, two developing units 6 may be vertically stacked. Since the vertical thickness of each developing unit 6 must be reduced in the foregoing case, the cover 40 is made to be slidable in the XY plane and vertical movement in the direction of the Z-axis is inhibited. That is, the cover 40 is supported by the X-axis drive mechanism (not shown) or the Y-axis drive mechanism (not shown) so as to be moved horizontally in parallel within the chamber 6a.

The operation of developing the substrate S by using the foregoing developing unit 6 will now be described.

Initially, the substrate S is discharged from the cassette 2 of the cassette station 3 by the sub-arm 5 to deliver the substrate S to the main arm 4. The main arm 4 introduces the substrate S into the brush scrubber 7 so that the substrate S is cleaned with the brush. Then, the substrate S is dried in the heating units 9. Note that the substrate S may be cleaned with high pressure jet water in the high-pressure jet cleaning machine 8 if necessary for a process to be performed.

Then, the substrate S is subjected to the adhesion process by the adhesion unit 11. Then, the substrate S is cooled by the cleaning unit 12 for cooling, and then a resist is applied to the surface of the substrate S by the resist-film applying unit 14. Then, the substrate S is subjected to a baking process by the heating units 13, and then the resist film is subjected to an exposing process by an exposing unit (not shown). Then, the substrate S, which has been exposed to light, is introduced into the developing unit 6.

In the developing unit 6, the support 21 is initially moved upwards to receive the substrate S from the main arm 4, and then suck and hold the substrate S. Then, the support 21 is moved downwards. Then, the cover 40 covers the upper surface of the substrate S. Thus, the narrow clearance 41A of about 0.5 mm to about 1 mm is formed between the upper surface of the substrate S and the cover 40.

After the cover 40 has been mounted, the developer is supplied into the clearance 41A in a circular manner so that the resist film of the substrate S is developed. The developer is introduced into the clearance 41A from the developer supply source 33 through the inlet portion 42. Then, the developer flows while being brought into contact with the upper surface of the substrate S, and then discharged through the outlet portion 43, followed by being returned to the developer supply source 33. The developer is, in the clearance 41A, formed into a laminar flow so that the developer is uniformly supplied in a small quantity. As a result, an excellent developing process can be performed. Since a novel developer is always supplied to the upper surface of the resist film, the time required to complete the development can be shortened.

After the development process has been completed, the fluid switch valve 35 is operated to switch the flow path so that the rinsing solution is supplied into the clearance 41A from the rinsing-solution supply source 34. As a result, the developer left on the substrate S is cleaned. Simultaneously with supply of the rinsing solution, cleaning water is sprayed to the reverse surface of the substrate S from a nozzle (not shown) disposed below the substrate S so that the reverse surface of the substrate S is cleaned.

After the rinsing process has been completed, dry gas is supplied into the clearance 41A from the dry-gas supply source 36 so that the substrate S is dried. After the substrate S has been dried, the cover 40 is removed from the substrate S. When the cover 40 is removed, previous injection of dry gas or the like into the clearance 41A enables the cover 40 to be removed easily. Then, the substrate S is heated by the heating units 9, and then accommodated in the cassette 2 of the cassette station 3.

The developing unit has the foregoing structure in which the developer is formed into a laminar flow which flows along the upper surface of the substrate S so that the developer is uniformly supplied to the upper surface of the resist film. Since a novel developer is always supplied to the resist film, the time required to complete the development process can be shortened and, therefore, the throughput can be improved. Moreover, since the foregoing unit is not required to have the spinning mechanism, the overall size of the unit can be reduced.

A variety of modifications of the foregoing embodiment will now be described.

As shown in FIG. 9, the two surfaces of the substrate S may be in contact with the treatment liquid in a cover 40A. The cover 40A comprises a lower cover member 40a and an upper cover member 40b. The central portion on the inside of the lower cover member 40a is recessed. When the substrate S is placed on the lower cover member 40a, a lower clearance 41B is formed between the lower cover member 40a and the substrate S. The upper cover member 40b is supported by the rod 30a of the air cylinder 30 so as to be capable of moving vertically. When the upper cover member 40b is set to cover the lower cover member 40a, an upper clearance 41A is formed between the upper cover member 40b and the substrate S. The lower cover member 40a and the upper cover member 40b are formed to be brought into contact with each other at their peripheral portions. A sealing O-ring 46 is disposed on the surface of contact. As a result, outward leakage of the treatment liquid introduced into the upper and lower clearances 41A and 41B can be prevented.

The foregoing cover 40A enables the treatment liquid to flow into the upper and lower clearances 41A and 41B and causes the treatment liquid to be retained in the same. That is, since the cover 40A enables the substrate S to be dipped in the treatment liquid for a predetermined time, it is suitable to be employed in the development process.

Figure 11:
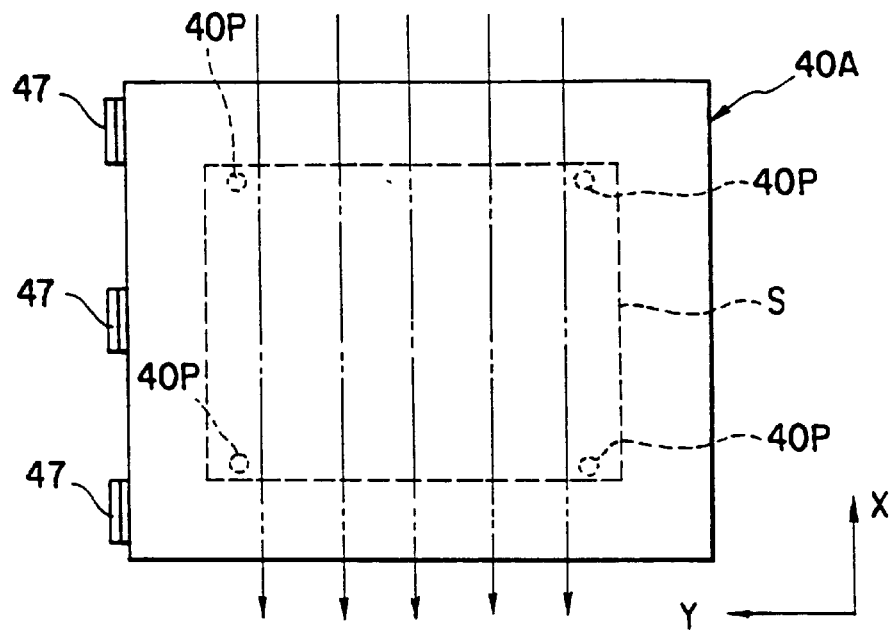
FIG. 11 is a plan view showing a dipping-type apparatus for processing a substrate having a cover opening and closing mechanism.

As shown in FIG. 10, an opening/closing type cover 40B may be employed to cause the treatment liquid to be brought into contact with the two surfaces of the substrate S. The cover 40B comprises upper and lower cover members 40g and 40h, one sides of which are connected to each other by a hinge 47. In the case where the treatment liquid is allowed to flow along the short side of the substrate S as shown in FIG. 11, the distance for which the treatment liquid must flow can be shortened. Thus, deterioration in the treatment liquid can be prevented satisfactorily so that the processing efficiency is further improved.

In a case where the process for rinsing the substrate S is performed such that the rinsing solution in the clearances 41A and 41B is oscillated with ultrasonic waves transmitted from the ultrasonic oscillator 44, the particles can be readily released from the surface of the substrate. This helps to enhance the efficiency of the washing.

Figure 12:
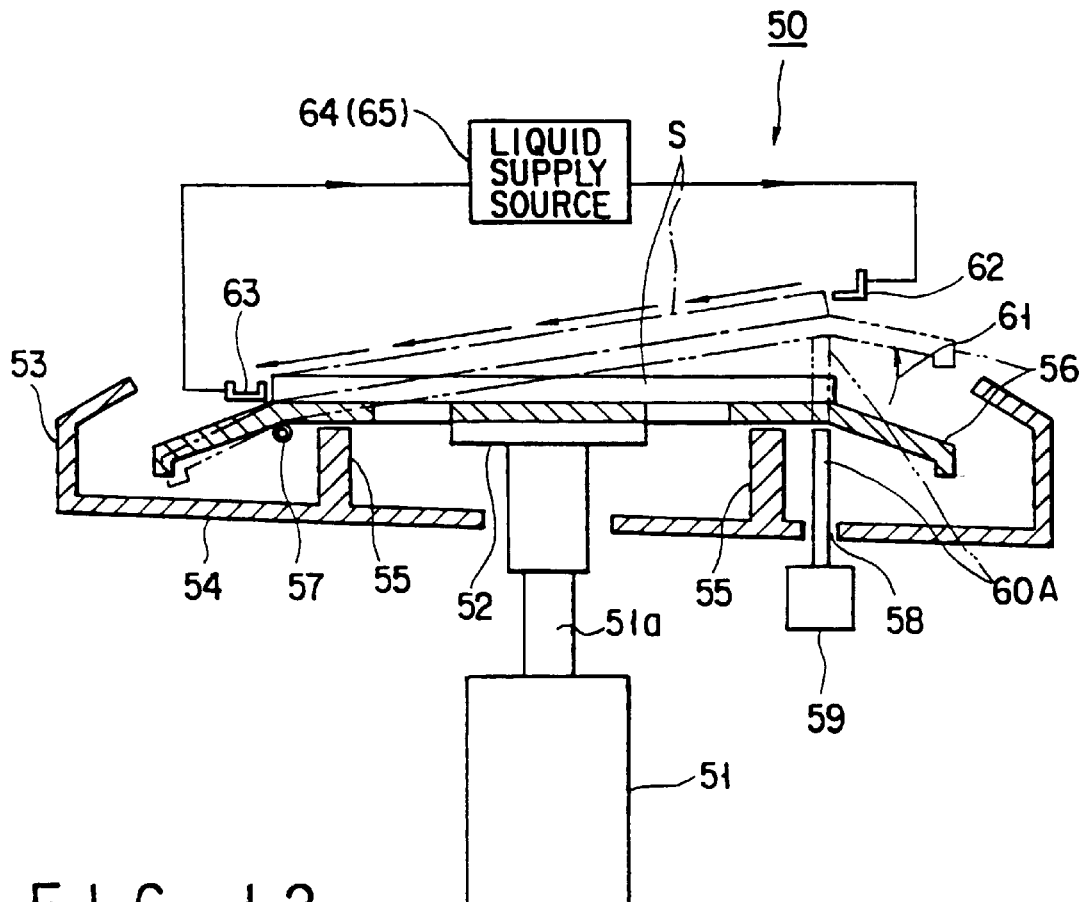
FIG. 12 is a partial cross sectional view schematically showing an apparatus for use in a resist processing method according to a second embodiment of the present invention.

Referring to FIGS. 12 to 14, a second embodiment of the present invention will now be described.

As shown in FIG. 12, a support 52 having a rectifying plate 56 is disposed in the central portion of the chamber of the development unit 50. The substrate S is placed on the rectifying plate 56 and the support 52. Moreover, a vacuum suction mechanism (not shown) sucks and holds the substrate S on the upper surface of the support 52. The lower surface of the support 52 is connected to an internal mechanism of a drive portion 51 through a shaft 51a. The drive portion 51 includes a Z-cylinder (not shown) for vertically moving the support 52 and a Q-motor (not shown) for spinning the support 52.

A cup 53 is formed to surround the substrate S sucked to and held on the support 52. The cup 53 has a bottom portion 54 on which an annular wall 55 is stood erect. The rectifying plate 56 is disposed adjacent to the top end of the annular wall 55.

The rectifying plate 56 is supported in such a manner that it is able to swing in the cup 53 relative to a hinge portion 57. The bottom portion 54 of the cup 53 has an opening 58. When a pin 60A is projected upwards through the opening 58, one side of the rectifying plate 56 is raised by the pin 60A. The pin 60A is supported by a plunger 59, the operation of which is controlled by the control unit 45.

When the pin 60A pushes the rectifying plate 56 upwards, the substrate S is, together with the rectifying plate 56, pushed upwards in a direction indicated by an arrow 61 so that the substrate S is inclined by an angular degree of about 10°. A supply gutter 62 is disposed adjacent to the upper portion of the inclined substrate S, while a receiving gutter 63 is disposed adjacent to the lower portion of the inclined substrate S. The supply gutter 62 has a slit-shape supply port. A developer supply unit 64 or a rinsing-solution supply unit 65 is disposed in the flow path of the supply gutter 62 and the receiving gutter 63.

The developer is supplied from the developer supply unit 64, followed by being allowed to flow downwards onto the substrate S from the upper portion of the inclined substrate S through the supply gutter 62. Then, the developer reaches the lower portion of the substrate S, and then the developer is introduced into the receiving gutter 63. Then, the developer is returned to the developer supply unit 64. By using the rinsing-solution supply unit 65, the inclined substrate S can be rinsed by a similar process.

In the case where the developer is allowed to flow along the upper surface of the substrate S as shown in FIG. 13, it is preferable that a guide member 71 having guide walls 70 at the two ends thereof be employed. That is, when the substrate S is, together with the guide member 71, placed on the support 52, the developer is guided by the guide walls 70 so that side leakage of the developer from the upper surface of the substrate S is prevented. Thus, the developer is caused to flow into the receiving gutter 63. Note that the substrate S is placed on the support 52 by the main arm 4, as shown in FIG. 14.

Since the treatment liquid does not splash to the surrounding portion in the foregoing unit according to this embodiment, the inner surface of the cup 22 (53) and portion around the same cannot be contaminated. Therefore, a clean environment can be maintained, and adhesion of particles to the substrate S can substantially be prevented. Moreover, an advantage can be realized in maintaining the apparatus as compared with the conventional apparatus. Since a new developer is always supplied to the upper surface of the resist film, the time required to complete the development process can be shortened and, therefore, the throughput can be improved. Moreover, since the developer can be recycled, the running cost can be reduced and an economical advantage can be realized.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An apparatus for processing a large-sized substrate, used to form a liquid crystal display, utilizing a treatment liquid including a developing solution or a rinsing solution, the apparatus comprising:

a chamber;

a support on which a substrate to be introduced into said chamber is placed, the substrate having a photoresist film;

a cover for covering the substrate in such a manner that a clearance is formed from at least either surface of the substrate placed on said support;

supply means for supplying a treatment liquid from a first side of said cover into said clearance; and discharge means for discharging the treatment liquid from said clearance to a second side of said cover so that the treatment liquid is formed into a laminar flow that is substantially parallel with a surface of the photoresist film in said clearance, so as to bring the treatment liquid while flowing into contact with the photoresist film.

2. An apparatus according to claim 1, further comprising elevation means for elevating said cover.

3. An apparatus according to claim 1, further comprising elevation means for elevating said support.

4. An apparatus according to claim 1, wherein said cover has, in the peripheral portion of the lower surface thereof, a plurality of projections for pushing the substrate.

5. An apparatus according to claim 1, wherein said cover has an ultrasonic oscillator.

6. An apparatus according to claim 1, wherein said cover is formed into a substantially rectangular shape.

7. An apparatus according to claim 1, wherein the treatment liquid supply means has developer supply source for supplying a developer into said clearance;

rinsing liquid supply source for supplying rinsing liquid into said clearance; and flow-path switch valve for switching the flow path of said developer supply source and the flow path of said rinsing liquid supply source.

8. An apparatus according to claim 1, wherein said cover has an upper cover member for forming an upper clearance from the upper surface of the substrate;

a lower cover member for forming a lower clearance from the lower surface of the substrate; and a sealing member to be disposed between said upper and lower covers which are brought into contact with each other.

9. An apparatus according to claim 1, further comprising:

dry gas supplying means for supplying a dry gas into the clearance so as to dry the cover and the substrate.

10. An apparatus according to claim 1, further comprising:

a regenerating unit configured to regenerate the liquid discharged from the clearance and supply the regenerated liquid to the supply means so that the regenerated liquid is reused.

11. An apparatus according to claim 2, further comprising:

control means for controlling a movement of the elevation means in such a manner that the clearance is set within a range of 0.5–2 mm.

12. An apparatus for processing a large-sized substrate, used to form a liquid crystal display, utilizing a treatment liquid including a developing solution or a rinsing solution, the apparatus comprising:

a cup;

a support which is disposed in said cup and on which a substrate having a photoresist film is placed;

means for inclining the substrate placed on said support with respect to a horizontal plane;

a supply gutter for supplying treatment liquid from a position adjacent to an upper portion of said inclined substrate; and a receiving gutter for receiving the treatment liquid at a position adjacent to a lower portion of said inclined substrate so that the treatment liquid is formed into a laminar flow that is substantially parallel with a surface of the photoresist film in said clearance, so as to bring the treatment liquid while flowing into contact with the photoresist film.

13. An apparatus according to claim 12, further comprising:

dry gas supply means for spraying dry gas onto the substrate so as to dry the substrate.

14. An apparatus according to claim 12, further comprising:

a regenerating unit configured to regenerate liquid that has been in contact with the substrate and supply the liquid that has been regenerated to the supply means so that the regenerated liquid is reused.

* * * * *